United States Patent [19]

Haley

[11] Patent Number: 5,006,962
[45] Date of Patent: Apr. 9, 1991

[54] APPARATUS FOR SURFACE MOUNTING AN INTEGRATED CIRCUIT PACKAGE

[75] Inventor: Kevin Haley, San Jose, Calif.

[73] Assignee: Intel Corporation, Santa Clara, Calif.

[21] Appl. No.: 458,558

[22] Filed: Dec. 28, 1989

[51] Int. Cl.[5] .............................................. H05K 7/02
[52] U.S. Cl. ................... 361/417; 361/400; 361/420; 439/72
[58] Field of Search ............... 361/400, 405, 408, 417, 361/419, 420; 174/52.1, 52.4, 52.5; 439/68, 70, 72, 73; 206/331

[56] References Cited

U.S. PATENT DOCUMENTS 4,468,074  8/1984  Gordon .......................... 439/72 X
4,878,846  11/1989 Schroeder ..................... 361/400 X

FOREIGN PATENT DOCUMENTS 0020693  1/1989  Japan ............................ 439/72

Primary Examiner—Leo P. Picard
Assistant Examiner—Paramita Ghosh
Attorney, Agent, or Firm—Blakely, Sokoloff, Taylor & Zafman

[57] ABSTRACT

An apparatus for surface mounting an integrated circuit package onto a printed circuit board. Cantilever beams from a housing member extend inwardly toward a central opening and reside upon portion of the lead making contact to the printed circuit board. A tightening of the housing member onto the circuit board by retaining means causes the cantilever beam to provide a downward force to maintain lead contact to the electrical contact, as well as a sideward force for retaining the integrated circuit stationary.

6 Claims, 2 Drawing Sheets

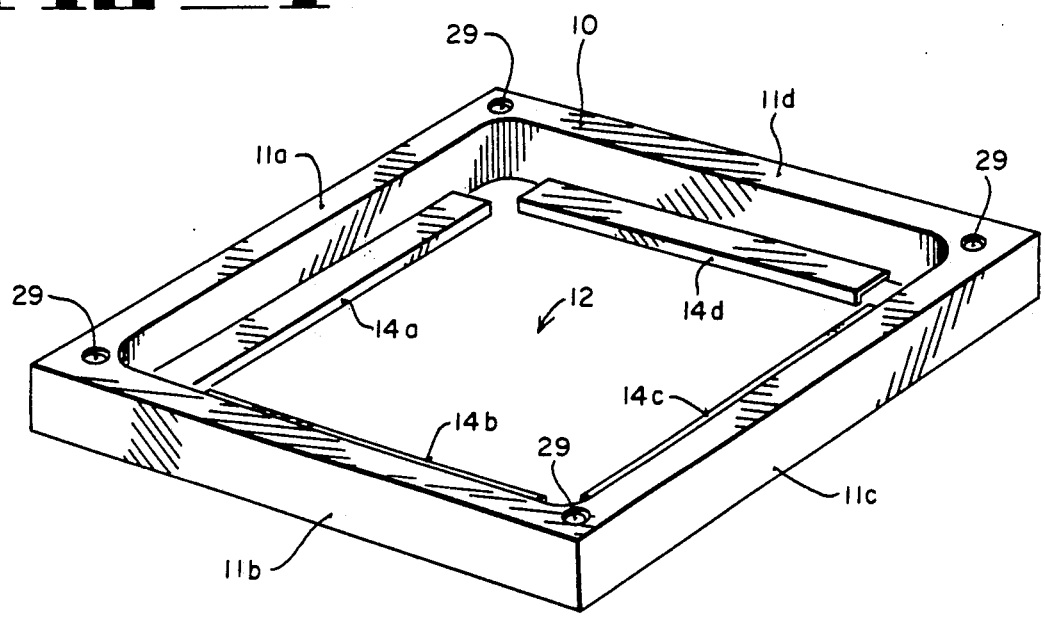
FIG_1
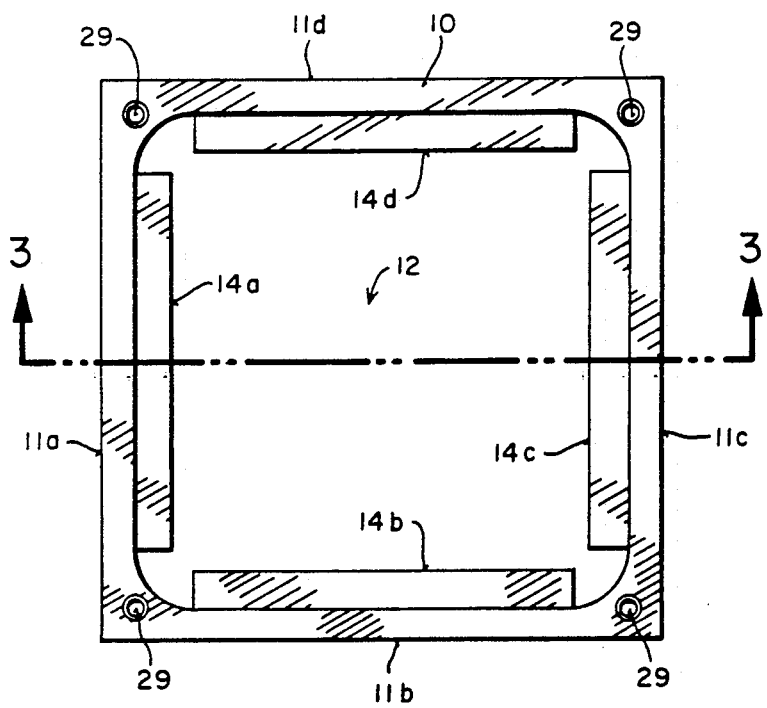
FIG_2
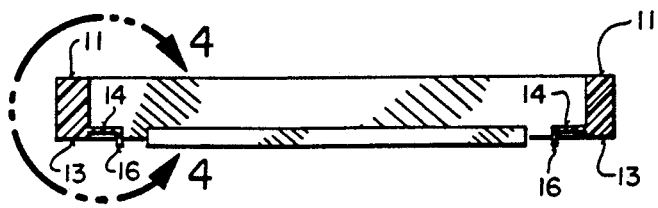
FIG_3

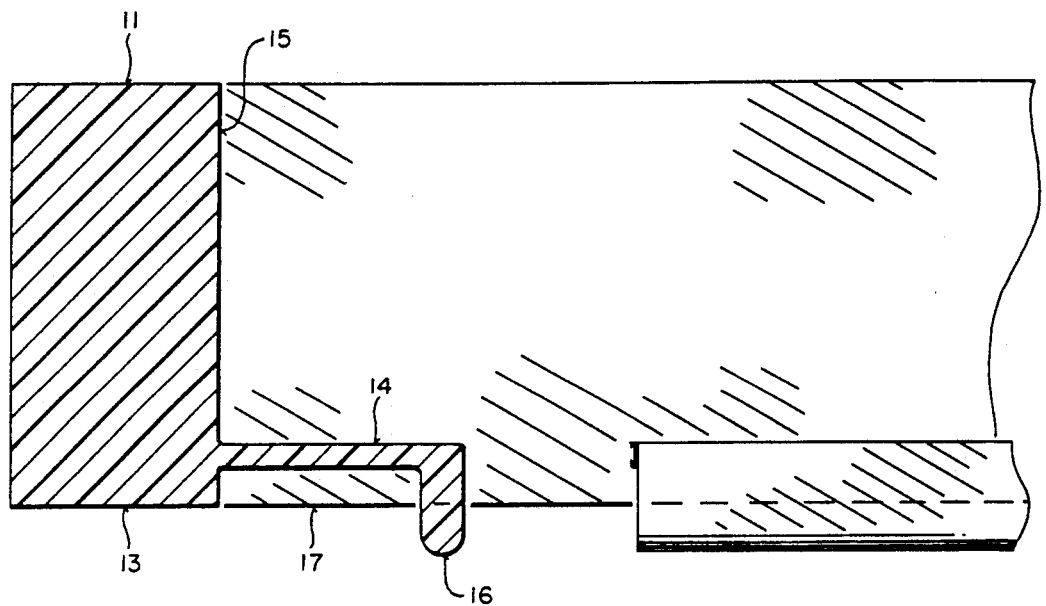
FIG_4
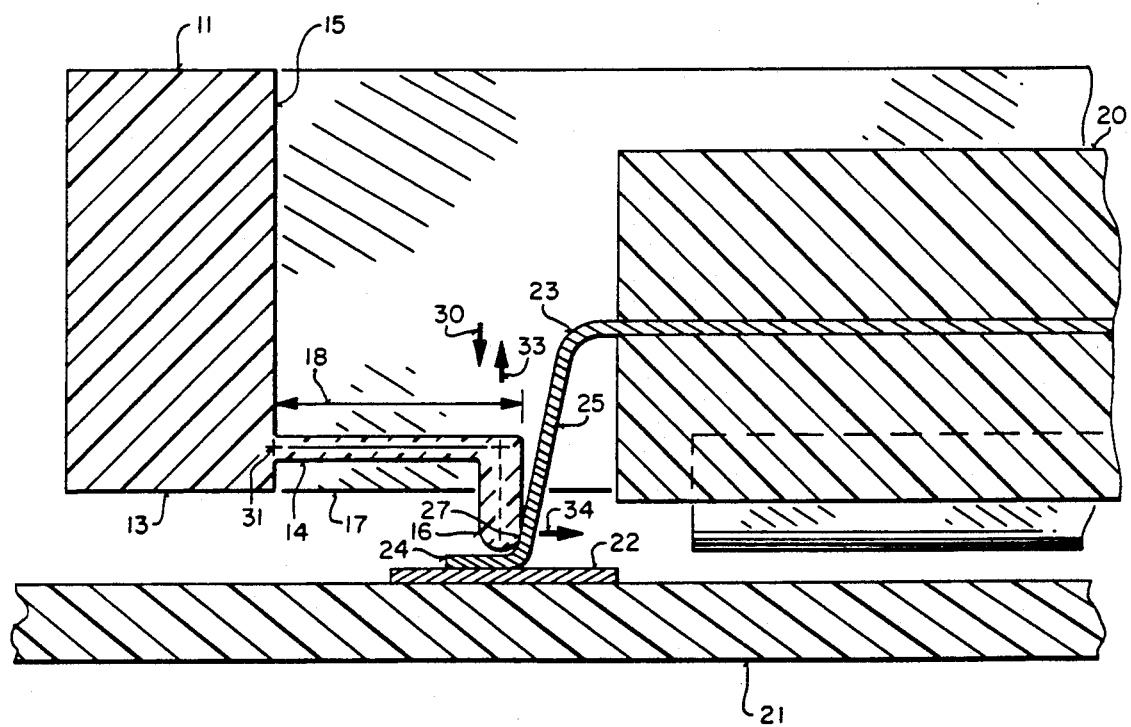
FIG_5

APPARATUS FOR SURFACE MOUNTING AN INTEGRATED CIRCUIT PACKAGE

BACKGROUND OF THE INVENTION

1. Field of the Invention

The present invention relates to the filed of integrated circuits, and more particularly, to devices for mounting integrated circuit packages.

2. Prior Art

Integrated circuit devices come in various shapes and sizes. Typically, integrated circuits (ICs) are fabricated on a semiconductor water. Each of the IC devices are then packaged in one of a variety of well-known packages. Typically, these packages are made from a dielectric material, such as ceramic, plastic or glass, in order to encase the IC within the package. In order to provide electrical connection to the electrical contact terminals of the IC, metallic leads are used. These metallic leads extend beyond the dielectric encapsulating material of the package. Prior art dual-in-line (DIP) packages, surface mount DIP packages which are also known as small outlines (SO), and flat packs are notable examples of packaging ICs.

In a typical application, these IC packages are mounted on circuit boards, modules, or sometimes directly onto the chassis or the casing of the equipment. In most of these instances the packages are designed to have the leads soldered to the attaching device, such as a printed circuit (PC) board. In such an implementation, the PC board is designed to have holes for receiving the leads of the IC package. The package is mounted on one side of the PC board with the leads extending through the holes to the other side of the PC board. The leads are then soldered for permanent physical and electrical connection to the PC board. This provides for a permanent attachment of the IC to the PC board.

A second technique for mounting IC packages onto a PC board utilizes surface mounting technology. Unlike the above described technique where the leads are inserted through the holes on the circuit board, surface mounted IC packages are mounted and soldered on the same side of the circuit board. Typically, solder pads are provided wherein the leads of the IC package are mated to its respective solder pad. The lead ends are formed to rest on the solder pad and are then soldered onto these pads.

However, a disadvantage of the above described techniques of soldering an IC onto a PC board is that it cannot be easily removed from the PC board. In order to provide for a less permanent affixation of the IC to the PC board, sockets are used on an intermediary between the IC and the PC board. When this technique is used, a socket is soldered onto a PC board and the IC is pressed onto the socket with the leads extending into contact portions of the socket. When a surface mount integrated circuit scheme is utilized, the socket is mounted onto the solder pad of the first side of the PC board, instead of having the leads of the socket pass through the circuit board. Then the surface mount IC is inserted into the socket for affixation to the PC board.

Although the use of IC sockets provides for a less permanent attachment of the IC package to the PC board, the additional lead length introduced, between the leads of the IC and the solder pad on the PC board, adds additional lead inductance which can be fatal in certain circuit applications. Furthermore, the IC socket still requires the use of solder to permanently affix the socket to the PC board.

It is appreciated then that a device for surface mounting an IC package onto a PC board without the use of solder or without the introduction of additional lead inductance would overcome the short comings of the prior art IC mounting techniques.

SUMMARY OF THE INVENTION

Present invention describes an apparatus for mounting an integrated circuit device onto a circuit board. The device essentially operates as a collar, which fits around the IC package. Cantilever beam portions extend outward from the inner edge of the device and further extend onto the lead portions of the integrated circuit. When the device is forced downward by a mounting means, the cantilever beams cause a downward force as well as an inward force upon the lead foot section of the lead. The downward force causes the lead to make contact with the solder pad of the circuit board while the inward force causes the lead to move toward the package. This inward force causes a scrubbing effect of the lead making contact to the bonding pad, as well as a tension against the beam for maintaining a force which prevents the package from moving. Thus a surface mount IC is mounted onto a surface of a PC board without a use of solder and does not introduce additional lead inductance.

BRIEF DESCRIPTION OF THE DRAWINGS

FIG. 1 is a pictorial view of an apparatus of the present invention.

FIG. 2 is an upper plan view of the device of FIG. 1.

FIG. 3 is a cross-sectional view taken across the line 3—3 of FIG. 2.

FIG. 4 is an expanded cross-sectional view showing a portion of a cantilever beam of the present invention taken across the line 4—4 of FIG. 3.

FIG. 5 is a cross-sectional view illustrating the placement of the cantilever beam of FIG. 4 onto a lead of an integrated circuit package when placed onto a printed circuit board.

DETAILED DESCRIPTION OF THE PRESENT INVENTION

An apparatus for affixing a surface mount integrated circuit (IC) package onto a printed circuit (PC) board is described. In the following description, numerous specific details, such as specific shapes, sizes, etc., are set forth in order to provide a thorough understanding of the present invention. However, it will be obvious to one skilled in the art that these specific details are not necessarily required to practice the present invention. In other instances, well-known techniques, such as molding of plastic, are not described in order not to obscure the present invention in unnecessary detail.

Referring to FIGS. 1 and 2, a device 10 for mounting a surface mount IC onto a PC board is shown. Device 10 has a four side shape, wherein four sides 11a–d encompass a central opening 12. Although the actual shape and size of device 10 is a design choice, the central opening 12 must be of a sufficient size for having a particular IC package to reside therein. Therefore, actual shape and size of opening 12 is dependant on the shape and size of the IC package which is to be mounted by using device 10. Due to the functionality of device 10, it is also referred to as a collar 10.

As is shown in FIGS. 1, 2, and also in the cross-sectional view of FIG. 3, a cantilever beam 14a-d extrudes inwardly toward opening 12 from each of its respective sides 11a-d. The length of each beam 14a-d, and the extent of the protrusion of each beam 14a-d into opening 12, is dependant on the size and shape of the IC, as well as its lead dimensions, which are to be mounted. Essentially, device 10 operates as a collar to be disposed over the surface mount IC package for mounting the IC package onto the PC board.

As will be described below the complete IC package resides within opening 12. However, each beam 14a-d must extrude sufficiently into opening 12 to reside over the leads of the IC package. At each corner of device 10 is a hole 29 which extends completely through therein for the purpose of permitting a retaining means, such as a screw, to mount device 10 onto a PC board.

As is shown in the cross-sectional view of FIG. 3 and the expanded drawing in FIG. 4, as well as FIGS. 1 and 2, each beam 14 (reference 14 denoting any one or all of beams 14a-d) extrudes from its respective side 11 (reference 11 denoting any one or all of sides 11a-d) from a location proximal to the bottom surface 13. A distal end 16 of each beam 14 is formed to be bent downward toward bottom surface 13 at an angle of approximately 90°. The formation of distal end 16 is such that it must extend beyond the plane 17 formed by the bottom surface 13 of device 10. It is to be noted that although only a portion of one beam 14 is shown in FIG. 4, each of the beams 14a-d has the same cantilever structure with distal end 16.

In practice, a surface mount integrated circuit 20 which is to be mounted is first placed into device 10 and then is placed onto PC board 21 as is shown in FIG. 5. PC board 21 includes a plurality of solder pads 22, wherein a lead 23 extending outward from package 20 has its lead foot 24 resting upon pad 22. Although not shown, it is appreciated that package 20 has a plurality of leads extending outward from it and these leads rest on various pads 22. Furthermore, with a typical package 20, be it a surface mount DIP or a flat-pack, the leads extending outward from a given side of the package 20 are arranged uniformly in a row such that the feet 24 of the leads are arranged in a straight line.

The device 10 opening is such that package 20 is slightly forced into place and the leads 23 are slightly deflected inwards. This deflection provides for a force fit which keeps the package 20 in device 10 and eliminates any tolerance mismatch between the package 20 and device 10.

The device 10 with the attached package 20 is then affixed to the PC board 21 using shoulder screws. The non-threaded portion of the shoulder screws pass through opening 29 and through PC board 21 with such a tolerance that each lead 23 contacts its corresponding pad 22 sufficiently to provide adequate electrical contact area.

Once package 20 has been attached to device 10, it is then placed onto PC board 21, such that each lead foot 24 rests upon its respective pad 22. As was noted above, the size and shape of opening 20 must be such as to accommodate package 20. The length 18 of the extrusion of beam 14 from inner sidewall 15 of device 10 must be of sufficient length 18 in order for distal end 16 to reside upon lead foot 24.

However, in order to obtain optimized connection of lead foot 24 onto pad 22, length 18 must be of sufficient length in order that outer surface 27 of distal end 16 resides along or adjacent to a vertical portion 25 of lead 23. That is, not only must distal end 16 reside on lead foot 24, but outer surface 27 of distal end 16 must be along or adjacent to the bend area separating lead foot 24 from vertical portion 25.

Once device 10 has been fitted around package 20 and then onto PC board 21, device 10 is forced downward toward PC board 21 by the action of tightening the retaining mechanism, such as shoulder screws, inserted in mounting holes 29. Because the center of rotation of beam 14 is located at apex 31, beam 14 exerts an upward force 33 opposite to a downward mounting force 30 when the retaining means is tightened. Beam 14 operates as a cantilever such that as distal end 16 presses down upon lead foot 24, beam 14 also pivots about apex 31 causing distal end 16 to not only move upward 33 but also inward 34 toward lead section 25. Thus, as bottom surface 13 is further forced downward toward PC board 21, digital end 16 is forced inward 34, also forcing lead portion 25 to move inward, shown as direction 34. Because digital end 16 places a downward force keeping lead foot 24 on pad 22, lead foot 24 scrapes along pad 22 as lead 23 moves inward in direction 34. An adhesion created by the contact of foot 24 to pad 22 as foot 24 moves along pad 22, causes a scrubbing action of the two metal contacts and, thereby, providing for a good electrical contact of lead foot 24 onto pad 22.

Finally when the bottom surface 13 of device 10 resides upon or is proximate to PC board 21, a substantial downward force is exerted by end 16 of beam 14 upon lead foot 24, causing lead foot 24 to have a good physical as well as electrical contact onto pad 22. Additionally, the lateral force 34 exerted by the pivoting movement of beam 14 causes beam section 25 to exert tension against distal end 16, thereby preventing package 20 from moving within opening 12.

It is to be appreciated that the length 18 of beam 14, as well as the location of the apex 31, in reference to bottom surface 13 is dependent on the design of package 20 and the lead 23 configuration. What is important is that each distal end 16 extends past the bottom surface 13 of device 10 in order that each cantilever beam 14 can flex about apex 31 by having each distal end 16 move both upwards and inwards.

It is to be noted that device 10 of the preferred embodiment, as shown, is designed for surface mounting in a square flat-pack package, such as a 196 lead package. Because a 196 lead package has leads extending from all four of its sides, device 10 has four cantilever beam sections extending into opening 12, such that each distal end 16 of each beam 14 rests upon the lead feet of all leads of its corresponding side of the IC package.

However, it is to be noted that if other package shapes are used, such as a surface mount DIP package, then the shape of device 10 will be dependant upon the package. That is, for affixing a surface mount DIP package, device 10 would be rectangular in shape having only two opposing cantilever sections along the long dimension of the rectangle.

It is to be further appreciated that because substantial force is exerted downward as well as inward on lead 23, and because of the scrubbing action of foot 24 on pad 22, actual soldering of lead 23 onto pad 22 is not required. Further, because of the absence of sockets, additional lead inductance is not introduced, since lead foot 24 rests directly onto pad 22.

Thus a device for mounting surface mount IC onto a PC board without the use of solder or the presence of additional lead inductance is described. Although a particular embodiment is described, other embodiments can be readily implemented without departing from the spirit and scope of the present invention.

I claim:

1. An apparatus for mounting an integrated circuit onto a base, wherein leads of said integrated circuit reside upon electrical contacts of said base, comprising:

a housing member having a central opening, wherein said housing member is disposed over said integrated circuit residing on said base and wherein said integrated circuit resides within said central opening;

at least two beam members integral with said housing member and extending inwardly toward said central opening from said housing member from at least two opposing sides of said housing member, each of said beam members having a distal end which forms an angle downwardly toward leads of said integrated circuit such that each said distal end resides over lead portion of said integrated circuit residing on said contacts;

retaining means coupled to said housing member for retaining said housing member on said base, wherein tightening said retaining means causes each of said distal ends to exert a sideward force on said leads to create tension in retaining said integrated circuit stationary and a downward force to retain said leads on said contact.

2. The apparatus of claim 1 wherein said housing member is square in shape.

3. The apparatus of claim 2 wherein said retaining means is a screw.

4. An apparatus for mounting a packaged integrated circuit onto a circuit board, wherein leads of said integrated circuit reside upon electrical contacts of said circuit board, comprising:

a housing member having a central opening, wherein said housing member is disposed over said integrated circuit residing on said circuit board and wherein said integrated circuit resides within said central opening;

said housing member having a cantilever beam extending inwardly toward said central opening from each side of said housing member, each said cantilever beam having a distal end which forms an angle downwardly toward leads of said integrated circuit such that each said distal end resides over lead portion of said integrated circuit residing on said contacts;

retaining means coupled to said housing member for retaining said housing member on said base, wherein tightening said retaining means causes each of said distal ends to exert a sideward force on said leads to create tension in retaining said integrated circuit stationary and a downward force to retain said leads on said contact.

5. The apparatus of claim 4 wherein said housing member is square in shape.

6. The apparatus of claim 5 wherein said retaining means is a screw.

* * * * *

UNITED STATES PATENT AND TRADEMARK OFFICE
CERTIFICATE OF CORRECTION

PATENT NO. : 5,006,962
DATED : 4/9/91
INVENTOR(S) : Kevin Haley

It is certified that error appears in the above-indentified patent and that said Letters Patent is hereby corrected as shown below:

Col. 1, line 13, Delete "water" and insert --wafer--.

Signed and Sealed this

Thirty-first Day of August, 1993

Attest:

BRUCE LEHMAN

Attesting Officer

Commissioner of Patents and Trademarks